(12) United States Patent
Gharib et al.

(10) Patent No.: US 11,081,969 B2
(45) Date of Patent: Aug. 3, 2021

(54) PRINTED CIRCUIT BOARD ARRANGEMENT FOR WELDING AND CUTTING APPARATUS

(71) Applicant: The ESAB Group Inc., Florence, SC (US)

(72) Inventors: Awad Gharib, Florence, SC (US); Muniswamappa Anjanappa, Florence, SC (US); Pranav Sanghavi, Florence, SC (US)

(73) Assignee: The ESAB Group Inc., Annapolis Junction, MD (US)

( * ) Notice: Subject to any disclaimer, the term of this patent is extended or adjusted under 35 U.S.C. 154(b) by 0 days.

(21) Appl. No.: 15/915,374

(22) Filed: Mar. 8, 2018

(65) Prior Publication Data
US 2018/0254713 A1    Sep. 6, 2018

Related U.S. Application Data

(63) Continuation of application No. PCT/US2016/052068, filed on Sep. 16, 2016.
(Continued)

(51) Int. Cl.
  *H02M 7/00* (2006.01)
  *H05K 7/14* (2006.01)
  (Continued)

(52) U.S. Cl.
  CPC ............ *H02M 7/003* (2013.01); *B23K 9/013* (2013.01); *B23K 9/1043* (2013.01); *B23K 9/16* (2013.01);
  (Continued)

(58) Field of Classification Search
  CPC ...... H02M 7/003; H02M 1/42; H05K 7/1427; H05K 1/181; H05K 1/0263; H05K 7/1432;
  (Continued)

(56) References Cited

U.S. PATENT DOCUMENTS

| | | | | |
|---|---|---|---|---|
| 4,661,792 A | * | 4/1987 | Watkins | ................. H05K 1/145 336/192 |
| 4,939,623 A | * | 7/1990 | Equi | ..................... H01F 27/027 336/107 |

(Continued)

FOREIGN PATENT DOCUMENTS

| | | |
|---|---|---|
| CN | 108029190 A | 5/2018 |
| EP | 1022085 A2 | 7/2000 |

(Continued)

OTHER PUBLICATIONS

ITW Welding Patents, Published Mar. 7, 2019 Updated Mar. 7, 2019.*

(Continued)

*Primary Examiner* — Adrian S Wilson
*Assistant Examiner* — Theron S Milliser
(74) *Attorney, Agent, or Firm* — Edell, Shapiro & Finnan, LLC

(57) ABSTRACT

A power supply to provide welding power. The power supply may include a first printed circuit board (PCB) disposed on a primary side of the power supply; a first set of components mounted on the first PCB; a second PCB disposed on a secondary side of the power supply; a second set of components mounted on the second PCB; a transformer stage coupled to the first PCB and to the second PCB, wherein the first PCB and the second PCB are independently detachable from the power supply.

6 Claims, 5 Drawing Sheets

Related U.S. Application Data

(60) Provisional application No. 62/220,544, filed on Sep. 18, 2015.

(51) Int. Cl.
| | |
|---|---|
| *H05K 1/02* | (2006.01) |
| *H05K 1/14* | (2006.01) |
| *B23K 9/10* | (2006.01) |
| *B23K 9/32* | (2006.01) |
| *B23K 9/16* | (2006.01) |
| *B23K 9/013* | (2006.01) |
| *H02M 1/42* | (2007.01) |
| *H05K 1/18* | (2006.01) |
| *H05K 3/30* | (2006.01) |

(52) U.S. Cl.
CPC ............... *B23K 9/32* (2013.01); *H02M 1/42* (2013.01); *H05K 1/0263* (2013.01); *H05K 1/14* (2013.01); *H05K 1/181* (2013.01); *H05K 3/303* (2013.01); *H05K 7/1427* (2013.01); *H05K 7/1432* (2013.01); *H05K 2201/086* (2013.01); *H05K 2201/1003* (2013.01)

(58) Field of Classification Search
CPC ............ H05K 1/14; H05K 2201/1003; H05K 2201/086; B23K 9/16; B23K 9/32; B23K 9/013; B23K 9/1043
See application file for complete search history.

(56) References Cited

U.S. PATENT DOCUMENTS

| | | | |
|---|---|---|---|
| 5,025,127 A | 6/1991 | Gilliland | |
| 5,642,260 A * | 6/1997 | Sigl ..................... | B23K 9/32 174/16.1 |
| 5,747,773 A * | 5/1998 | Griffin .................. | B23K 9/1006 219/130.1 |
| 5,831,240 A * | 11/1998 | Katooka .............. | B23K 9/323 219/130.1 |
| 6,081,423 A * | 6/2000 | Griffin .................. | B23K 9/1006 361/688 |
| 6,489,591 B1 * | 12/2002 | Achtner ................ | B23K 9/32 219/130.1 |
| 6,831,838 B1 * | 12/2004 | Boyce .................. | B23K 9/32 174/16.1 |
| 7,800,901 B2 * | 9/2010 | Borowy ................ | B23K 9/32 165/104.33 |
| 7,872,843 B2 * | 1/2011 | McGill, Sr. ............ | H05K 7/186 361/104 |
| 8,253,069 B2 * | 8/2012 | Buday .................. | B23K 9/1006 219/130.1 |
| 8,498,124 B1 * | 7/2013 | Folker .................. | H05K 1/145 361/740 |
| 8,530,789 B2 * | 9/2013 | Diekmann ............. | B23K 9/32 219/130.1 |
| 8,897,029 B2 * | 11/2014 | Kippley ................ | H02M 7/003 361/740 |
| 8,969,815 B2 | 3/2015 | Caruba et al. | |
| 9,148,066 B2 * | 9/2015 | Chen .................... | H01F 27/292 |
| 9,592,565 B2 * | 3/2017 | Sigl ..................... | H01L 23/4093 |
| 2006/0048968 A1 * | 3/2006 | Chen .................... | H02M 7/003 174/257 |
| 2009/0230941 A1 * | 9/2009 | Vogel ................... | B23K 9/091 323/305 |
| 2011/0036624 A1 * | 2/2011 | Kagimura ............. | H05K 1/0263 174/260 |
| 2012/0214321 A1 * | 8/2012 | Kagimura ............. | H01R 4/34 439/55 |
| 2013/0155724 A1 * | 6/2013 | Baurle ................. | H02M 1/42 363/15 |
| 2014/0028029 A1 * | 1/2014 | Jochman .............. | G05F 1/02 290/1 A |
| 2014/0029319 A1 * | 1/2014 | Jochman .............. | H05K 5/0213 363/67 |
| 2014/0327411 A1 * | 11/2014 | Gumaer ................ | H02M 1/42 323/208 |
| 2015/0093924 A1 | 4/2015 | Villarreal | |
| 2015/0137694 A1 * | 5/2015 | Hong ................... | H05B 33/0815 315/205 |
| 2016/0136749 A1 * | 5/2016 | Lee ..................... | B23K 9/091 219/130.1 |

FOREIGN PATENT DOCUMENTS

| | | |
|---|---|---|
| GB | 2320143 A | 6/1998 |
| WO | 2014150118 A1 | 9/2014 |

OTHER PUBLICATIONS

MAXSTAR service manual, 2008, Miller Electric Mfg. Co.*
International Preliminary Report on Patentability and Written Opinion of PCT/US2016/052068 dated Mar. 20, 2018, 7 pages.
Examination Report for Canadian Patent Application 2,998,178 dated Feb. 21, 2019, 5 pages.
Examination Report No. 1 for Australian Patent Application No. 2016323585 dated Jul. 12, 2018, 3 pages.
International Search Report of PCT/US2016/052068 dated Jan. 4, 2017.
Examination Report No. 1 for Australian Patent Application No. 2019201725 dated Nov. 18, 2019, 3 pages.
Preliminary Office Action for Brazil Patent Application No. BR112018004927-1 with English translation, dated Aug. 18, 2020, 5 pages.
Office Action from the Mexican Institute of Industrial Property for Mexican Patent Application No. MX/a/2018/003285 with English summary, dated Oct. 2, 2020, 7 pages.
Communication from European Patent Office for Application No. 16778935.3 dated May 11, 2021, 5 pages.

* cited by examiner

PRINTED CIRCUIT BOARD ARRANGEMENT FOR WELDING AND CUTTING APPARATUS

RELATED APPLICATIONS

This is a Continuation of PCT/US16/52068 filed on Sep. 16, 2016, which PCT claims the benefit of U.S. Provisional Patent Application No. 62/220,544, filed Sep. 18, 2015, and both of which are incorporated by reference herein in their entirety.

TECHNICAL FIELD

The present embodiments are related to power supplies for welding type power, that is, power generally used for welding, cutting, or heating.

BACKGROUND

In welding apparatus, welding power may be derived from an AC mains supplying power at a voltage of 90 V or greater, for example. The input AC power is converted and delivered to a workpiece at relatively higher current, up to thousands of amps, and relatively lower voltage, such as less than 50 V open circuit. For welding power supplies that deliver current such as 350 amps or less, power supply components are mounted on a single printed circuit board (PCB), facilitating integration of different sections of the power supply. These components may include a main inverter, boost converter including power factor control (PFC) component, auxiliary power supply, main transformer, capacitors, inductors, output diodes, among other components. This architecture may provide a convenient means for assembly and may additionally be less expensive to manufacture. For example, a given plating process may be used to provide a PCB conductor to be used to provide electrical interconnection between the different components mounted on the PCB. One potential drawback of such power supplies may be increased costs associated with servicing a power supply having the aforementioned architecture.

It is with respect to these and other considerations that the present disclosure is provided.

BRIEF SUMMARY

In one embodiment, a power supply to provide welding power, may include a first printed circuit board (PCB) disposed on a primary side of the power supply; a first set of components mounted on the first PCB; a second PCB disposed on a secondary side of the power supply; a second set of components mounted on the second PCB; a transformer stage coupled to the first PCB and to the second PCB, wherein the first PCB and the second PCB are independently detachable from the power supply.

In another embodiment, a method of assembling a welding power supply, may include attaching a first printed circuit board (PCB) on a primary side of the welding power supply; mounting a first set of components on the first PCB; attaching a second PCB on a secondary side of the welding power supply; mounting a second set of components on the second PCB; and electrically coupling a transformer stage to the first PCB and to the second PCB, wherein the first PCB and the second PCB are independently detachable from the welding power supply.

DESCRIPTION OF EMBODIMENTS

The present embodiments provide improvements over conventional apparatus used to provide power for welding or cutting. An apparatus appropriate for welding or cutting may be referred to herein for simplicity as a "welding power supply."

In various embodiments, a power supply for welding or cutting is provided with a plurality of printed circuit boards (PCB) to support various different components. In various embodiments, a power supply for generating 350 Amps (A) of less current may have a modular architecture where different components serving different functions are grouped onto different PCBs. This architecture differs from the architecture of conventional power supplies that output 350 A or less current, where components are grouped onto a single PCB.

Figure 1A:
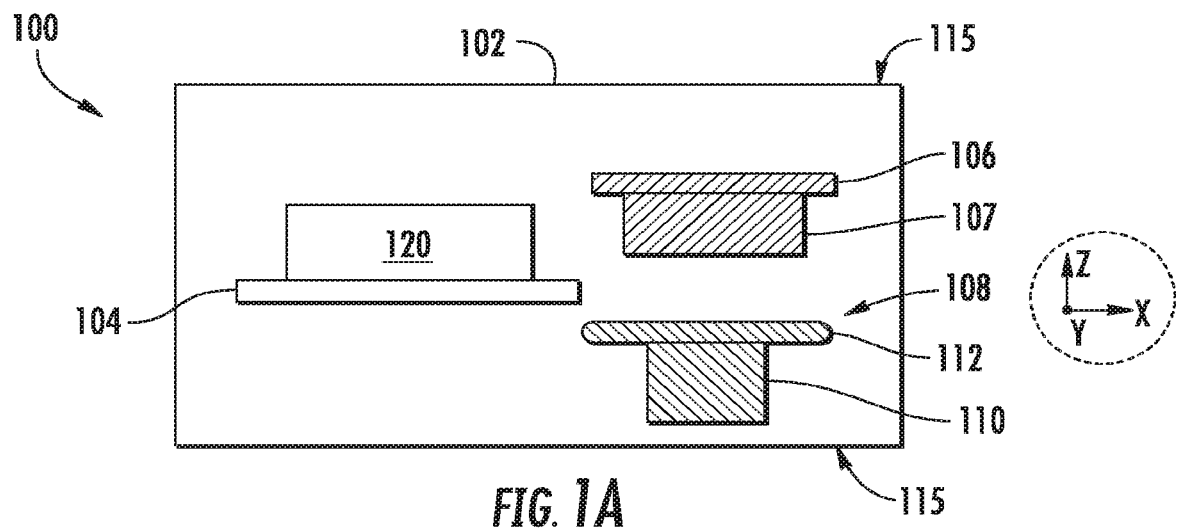
FIG. 1A depicts a block diagram in top plan view of an exemplary apparatus according to embodiments of the disclosure.
Figure 1B:
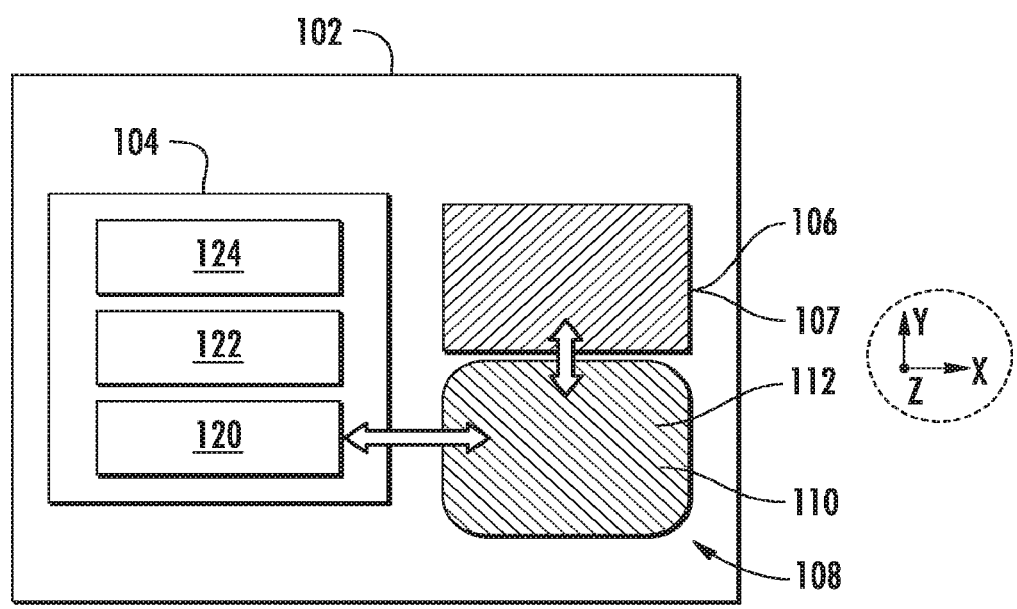
FIG. 1B depicts a block diagram in side view of the exemplary apparatus of FIG. 1A.

FIG. 1A depicts a block diagram in top plan view of an apparatus 100 according to embodiments of the disclosure. FIG. 1B depicts a block diagram in side view of the exemplary apparatus of FIG. 1A. The apparatus 100 may include a housing 102 for housing various components of apparatus 100, where the apparatus 100 includes a power supply. As illustrated, a first PCB, shown as PCB 104 is included in the housing 102. The apparatus 100 may further include known components such as a chassis (not shown) and one or more compartments (also not shown) within the housing 102, such as compartments to house a wire feeder or other parts. The components shown in the figures within the apparatus 100 and other apparatus generally pertain to a power supply used for welding or cutting.

The PCB 104 may include wiring to electrically connect various different components. In some embodiments, a main inverter 120 may be attached to the PCB 104. Additionally, a booster 122 including power factor correction (PFC) circuitry may be attached to the PCB 104, as well as an auxiliary power supply 124. In the embodiment of FIG. 1A, each of the components attached to the PCB 104 may be disposed on a primary side of the apparatus 100, meaning a high voltage/low current side. The booster 122 may function as in known boost converters to increase voltage to a target level of DC voltage. The main inverter 120 may function as in known inverters to invert the boosted DC voltage signal received from the booster 122. The PCB 104 may include other components (not shown), such as other power supply components generally disposed on a primary side of a main transformer as known in the art.

The apparatus 100 may further include a transformer stage 108 including a main transformer 110 mounted on a mount 112. In some examples, the main transformer 110 may be mounted directly on a chassis (not shown) contained within the housing 102. The main transformer 110 may be electrically coupled to the PCB 104 to receive a relatively higher voltage and relatively lower current input from the main inverter 120. The main transformer 110 may output a relatively lower voltage and higher current for use as welding power or cutting power, for example. The apparatus 100 may further include a PCB 106. In various embodiments the PCB 106 may include components such as output diodes, illustrated in FIG. 1A and FIG. 1B as secondary component 107. The PCB 106 may be disposed on a secondary side of the apparatus 100, meaning a relatively lower voltage, higher current side. The PCB 106 may receive output from the main transformer 110 as shown.

The apparatus 100 may be embodied in a "low current" power supply where welding power is supplied on the secondary side at currents of 350 A or less in a relatively smaller form factor apparatus, as opposed to higher current power supplies. Notably, the apparatus 100 may include a greater number of PCBs than conventional low current apparatus, where a single PCB may support the different power supply components. The arrangement of components in apparatus 100 provides flexibility not found in conventional apparatus, as discussed below. As an example, servicing of the apparatus 100 may be easier or less costly in the event of a failure of a component in the apparatus 100. For example, in various embodiments, the PCB 104, PCB 106 and transformer stage 108 are independently detachable from the housing 102. These components may be mounted directly or indirectly to the housing 102. For example, the PCB 104, transformer stage 108, and PCB 106 may be mounted to a chassis within the housing 102. Because the PCB 104, PCB 106 and transformer stage 108 are independently detachable from the housing 102, if a failure of a component on the PCB 106 takes place, for example, just the PCB 106 may be detached and serviced or replaced, while the PCB 104 and transformer stage 108 remain intact. This avoids the potential expense in servicing component failures in conventional apparatus where just one PCB hosts a transformer, inverter, PFC/booster component, and auxiliary power supply. In such a conventional configuration, a failure of one component may entail replacing the entire PCB and components, even if the other components are undamaged.

The modular architecture of apparatus 100 also provides flexibility in arrangement of different components. For example, referring in particular to FIG. 1A, there is shown an exemplary arrangement of different components of the apparatus 100. In this embodiment, the PCB 106 and PCB 104, having a generally planar shape, are arranged to lie parallel to the X-Y plane of the Cartesian coordinate system shown. In some examples, various components including different PCBs may be arranged so that different components are displaced from one another with respect to a given plane, such as the X-Y plane. For example, the PCB 104 may be arranged at a first level within the housing 102 with respect to a perpendicular (Z-axis) to the plane of PCB 104. The embodiments are not limited in this context. As also shown in FIG. 1A, the transformer stage 108 may include a main transformer 110 mounted on a mount 112. In some embodiments, the main transformer 110 may be mounted directly on a chassis. In either example, the main transformer 110 may be mounted at a second level with respect to the perpendicular, where the second level is different from the first level. Thus, the first level may be closer to a first side 115 of the housing 102 along the Z-axis, while the second level is closer to a second side 117 of the housing 102. The relative spacing between a first level and second level may be chosen to optimize air flow around the main transformer 110. Likewise, the PCB 106 may be arranged at a third level with respect to the perpendicular, as shown. This may provide a better design than a conventional design where the transformer is mounted on a PCB that is common to various other components such as inverter, booster/PFC, auxiliary power supply, and so forth. In the conventional design the air flow around the transformer may not be optimized because the transformer is mounted to a common PCB that houses other components.

Figure 2:
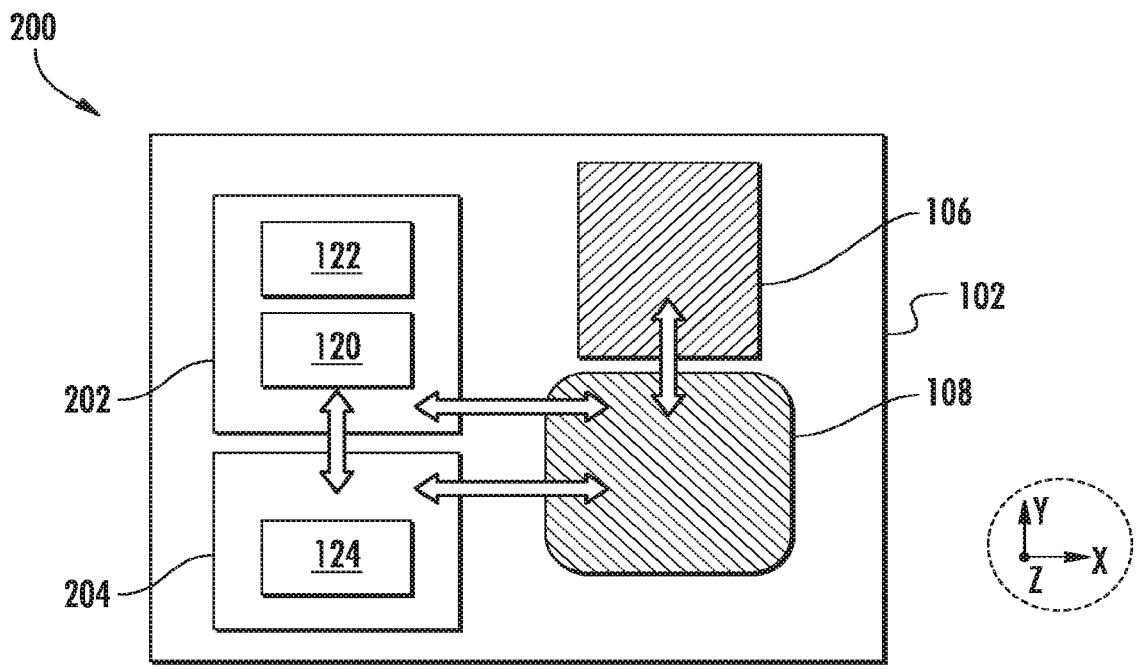
FIG. 2 depicts a block diagram of another exemplary apparatus.

Turning now to FIG. 2, there is shown a block diagram in side view of an apparatus 200 according to further embodiments of the disclosure. In this example, the apparatus 200 may include a housing 102, transformer stage 108 and PCB 106 generally as described above with respect to FIG. 1A and FIG. 1B. The apparatus 100 may further include a PCB 202 and PCB 204. In some examples the PCB 202 and PCB 204 may be disposed on the primary side of the apparatus 100 and may be electrically coupled to the transformer stage 108. In one embodiment, PCB 202 may include a main inverter 120 and a boost converter, shown as the booster 122, while the PCB 204 includes an auxiliary power supply 124. The PCB 202 and PCB 204 may be independently detachable from the housing 102, meaning that a PCB 202 may be removed without removing the PCB 204, or vice versa. This further modularity may provide increased flexibility and cost effectiveness. For example, if a component in the auxiliary power supply 124 fails, the PCB 204 may be serviced or replaced without removing the PCB 202, PCB 106, or without affecting the main inverter 120 or booster 122.

Figure 3:
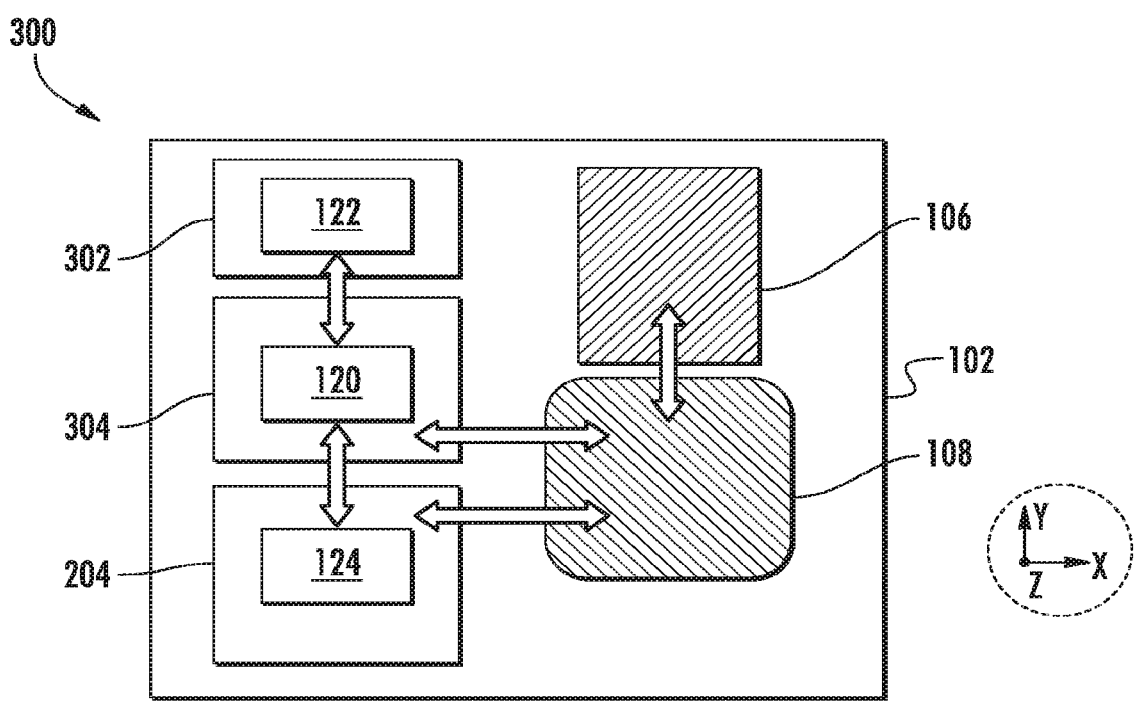
FIG. 3 depicts a block diagram of a further exemplary apparatus.

Turning now to FIG. 3, there is shown a block diagram in side view of an exemplary apparatus 300 according to further embodiments of the disclosure. In this example, the apparatus 300 may include a housing 102, transformer stage 108 and PCB 106 generally as described above with respect to FIG. 1A and FIG. 1B. The apparatus 100 may further include a PCB 204 supporting the auxiliary power supply 124 as discussed above. The apparatus may further include a PCB 302 attached to the main inverter 120 and a PCB 304 attached to the booster 122. In some examples the PCB 302, PCB 304 and PCB 204 may be disposed on the primary side of the apparatus 100 and may be electrically coupled to the transformer stage 108. The PCB 202 and PCB 302 and PCB 304 may be separately detachable from the housing 102. This further modularity may provide increased flexibility and cost effectiveness. For example, if a component in the auxiliary power supply 124 fails, the PCB 204 may be serviced or replaced without removing the PCB 302, PCB 304, PCB 106, or main transformer 110, and without affecting components such as the main inverter 120 or booster 122.

The architecture shown in FIGS. 1A, 1B, 2 and 3 provides further flexibility in designing and implementing different components of a power supply. In various embodiments, a given PCB on the primary side, such as PCB 104, PCB 202, PCB 204, PCB 302, or PCB 304, may be formed from a first copper layer having a first thickness. The first thickness may be designed to carry a relatively lower current. PCBs on the secondary side, such as PCB 106, may be designed with a second copper layer having a second thickness designed to carry a relatively higher current than the current on the primary side. Accordingly the second thickness may be greater than the first thickness. This approach may avoid having unnecessarily thick copper as may be found in a conventional low current power supply where primary and secondary components are mounted on a common PCB. In the conventional design, a relatively thicker common copper layer is thus formed throughout the PCB, even in regions of the PCB supporting low current components on the primary side, where thick copper conductor is not needed.

Figure 4A:
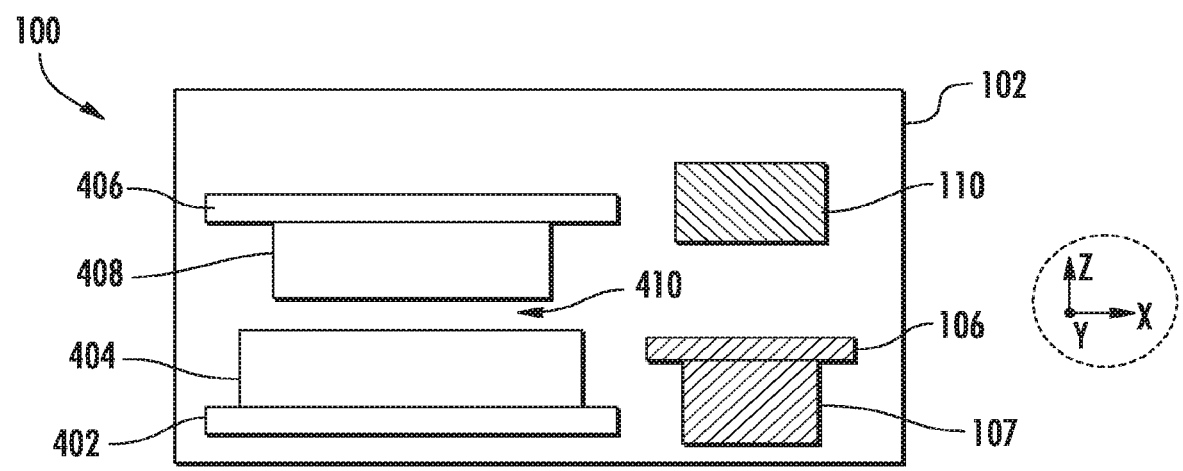
FIG. 4A depicts a block diagram in top plan view of a further exemplary apparatus according to embodiments of the disclosure.
Figure 4B:
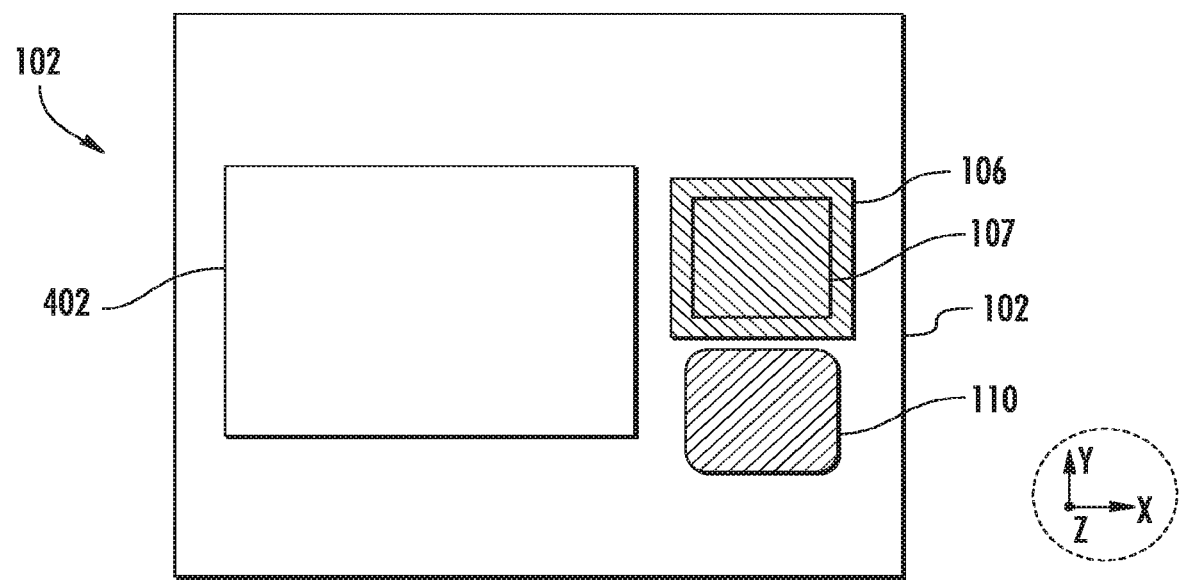
FIG. 4B depicts a block diagram in side view of the exemplary apparatus of FIG. 4A.

FIG. 4A depicts a block diagram in top plan view of a further exemplary apparatus according to embodiments of the disclosure. FIG. 4B depicts a block diagram in side view of the exemplary apparatus of FIG. 4. As shown, the apparatus 400 may include a housing 102 as discussed above. As shown, in addition to the main transformer 110, the apparatus may include a PCB 402 and PCB 406 on the primary side, and a PCB 106 on the secondary side. In the configuration shown in FIG. 4A, the PCB 402 may be attached to a booster 404, while the PCB 406 is attached to a main inverter 408. The booster 404 is shown as extending from the plane of the PCB 402 by virtue of heat sinks attached to electronic components (not shown) of the booster 404 as in known boost converters. Similarly, the main inverter 408 is shown as extending from the plane of the PCB 406 indicating the general shape of heat sinks used in the main inverter 408. The configuration of FIG. 4A provides heat sinks from the PCB 402 and PCB 406 that are opposed to one another and define a channel 410. The configuration of FIG. 4A provides advantages over conventional power supplies where an inverter and booster may be affixed to a common PCB, in that the channel 410 may act as a cooling channel conducting heat away from the PCB 402 and PCB 406.

Figure 5:
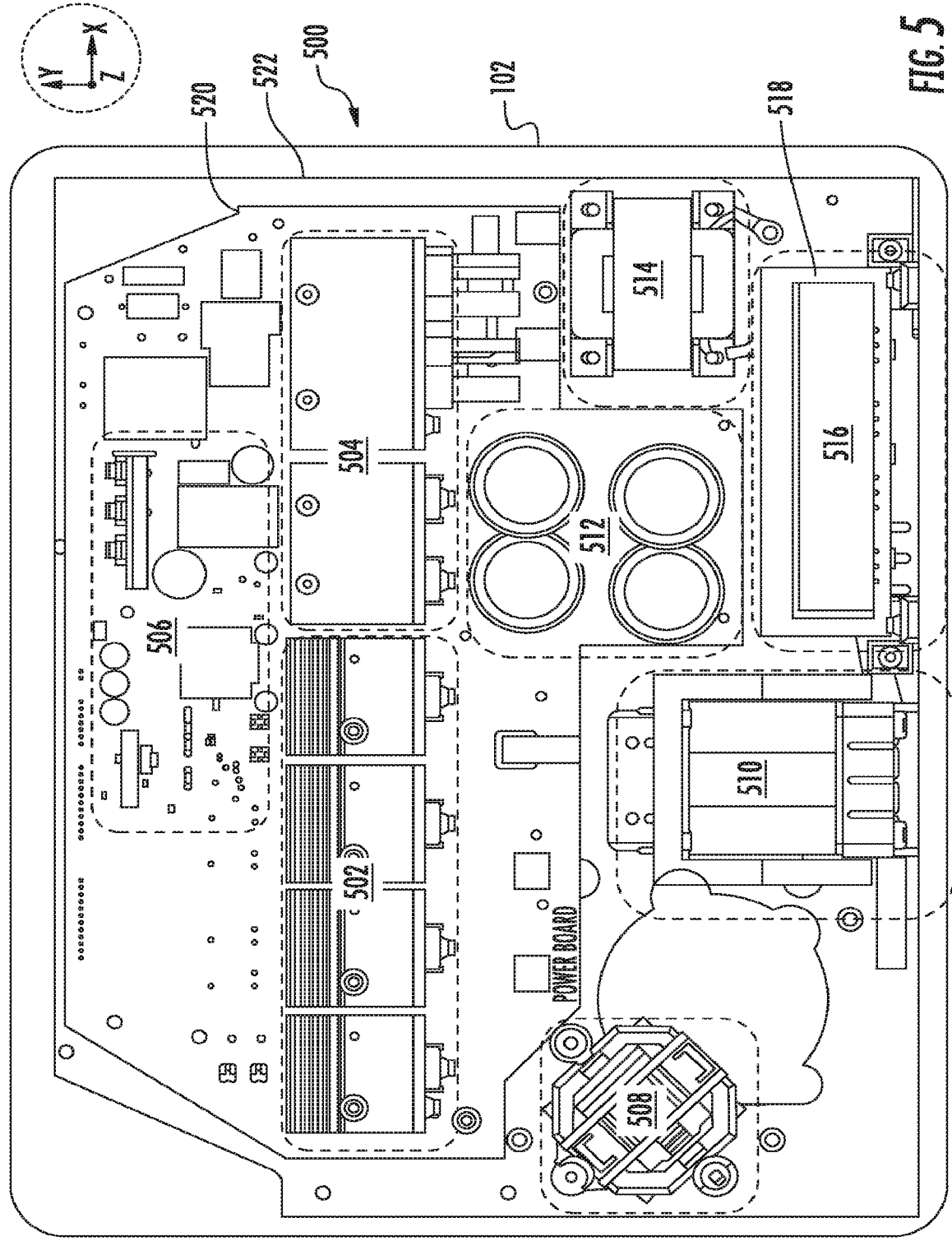
FIG. 5 depicts a block diagram of still another exemplary apparatus.

FIG. 5 depicts a block diagram of still another exemplary apparatus. In this example, the apparatus 500 includes a housing 102 that contains a chassis 522 as well as a primary PCB 520. The primary PCB 520 may reside on a primary side of the apparatus 500 and may be mounted to the chassis 522 or otherwise may be attached to the housing 102. The primary PCB 520 may be electrically connected to a main transformer 510, which transformer may be mounted on the chassis 522. The main transformer 510, in turn, may be electrically connected to a secondary PCB 518. The secondary PCB 518 may be disposed on the secondary side of apparatus 500. The secondary PCB 518 may be attached to an output diode assembly 516. The primary PCB 520 may have various components attached. For example, a main inverter 502, booster 504, auxiliary power supply 506, as well as DC bus capacitor bank 512 may be attached to the primary PCB 520. Additionally, an output inductor 508 as well as booster inductor 514 may be mounted to the chassis 522. The configuration in FIG. 5 provides flexibility in positioning of various components including the main transformer 510 and inductors. Additionally, serviceability of the apparatus 500 may be improved because failure of a component on the primary PCB 520 does not require replacement of the main transformer 510 or output diode assembly 516, or inductors, since the primary PCB 520 is separately detachable from the housing 102.

Figure 6:
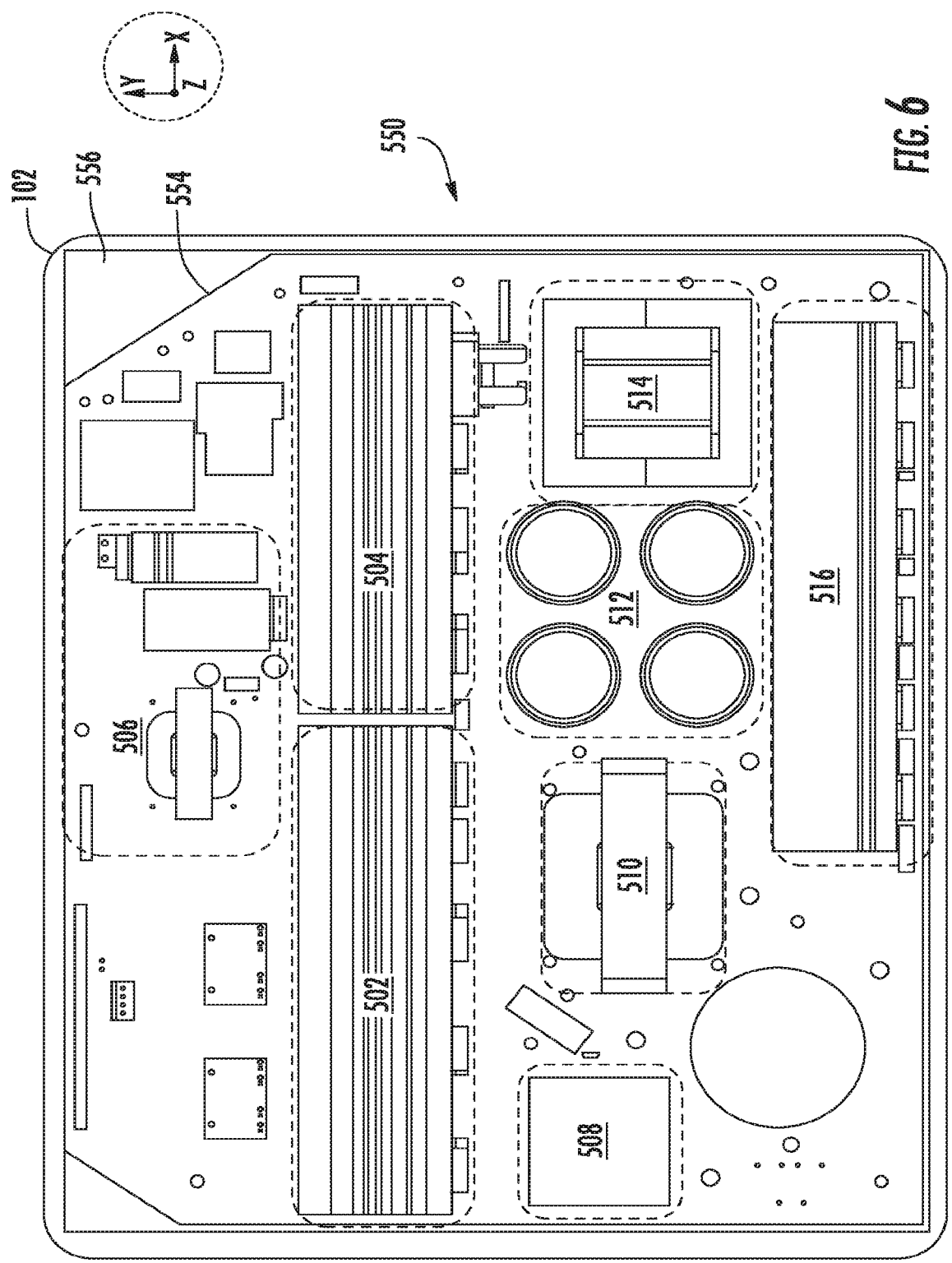
FIG. 6 depicts a block diagram of an apparatus having a conventional arrangement.

FIG. 6 depicts a block diagram of an apparatus having a conventional arrangement. In particular, the apparatus 550 may include a chassis 556 and PCB 554. The PCB 554 may be mounted to the chassis 556 for example. As shown in FIG. 6, the various aforementioned components in the apparatus of FIG. 5 may be mounted to a single PCB, PCB 554. While this architecture provides a possible advantage of a simple design that may be straightforward to manufacture, servicing of just one defective component on PCB 554 may entail removal of the PCB 554 or replacement of the entire PCB 554.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below are to be construed in view of the full breadth and spirit of the present disclosure as described herein.

What is claimed is:

1. A power supply to provide welding power, comprising:
   a first printed circuit board (PCB) disposed on a primary side of the power supply;
   a first set of components mounted on the first PCB including a boost converter and a boost converter heat sink;
   a second PCB disposed on the primary side of the power supply, wherein the second PCB comprises a totality of a main inverter and a main inverter heat sink, wherein the main inverter is configured to invert DC voltage supplied by the boost converter;
   a third PCB disposed on a secondary side of the power supply;
   a second set of components mounted on the third PCB; and
   a transformer stage coupling the primary side of the power supply to the secondary side of the power supply, wherein the first PCB the second PCB and the third PCB are independently detachable from the power supply, and wherein the boost converter heat sink and the main inverter heat sink are opposed to one another and define a cooling channel that is configured to conduct heat away from the first PCB and the second PCB.

2. The power supply of claim 1, wherein the first set of components includes a power factor correction (PFC) circuit.

3. The power supply of claim 1, further comprising a housing, wherein the first PCB is mounted at a first level within the housing with respect to a perpendicular to a plane of the PCB, and wherein the transformer stage is mounted at a second level within the housing with respect to the perpendicular.

4. The power supply of claim 1, wherein the third PCB includes a set of output diodes.

5. The power supply of claim 1, wherein the first PCB comprises a first copper layer having a first thickness, and wherein the third PCB comprises a second copper layer having a second thickness greater than the first thickness.

6. The power supply of claim 3, wherein the transformer stage is mounted to the housing.

* * * * *